US010680715B1

(12) United States Patent
Nuttgens et al.

(10) Patent No.: US 10,680,715 B1
(45) Date of Patent: Jun. 9, 2020

(54) DIGITAL IMPLEMENTATION OF CLOSED LOOP OPTICAL MODULATION AMPLITUDE CONTROLLER FOR LASER DIODE

(71) Applicant: Semtech Corporation, Camarillo, CA (US)

(72) Inventors: Jonah Edward Nuttgens, Southampton (GB); Andrew Hana, Bristol (GB); James Stephen Mason, Hampshire (GB)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 16/518,582

(22) Filed: Jul. 22, 2019

(51) Int. Cl.
*H04B 10/564* (2013.01)
*H04B 10/50* (2013.01)
*H03M 1/06* (2006.01)

(52) U.S. Cl.
CPC .... *H04B 10/50572* (2013.01); *H03M 1/0626* (2013.01); *H04B 10/564* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,384,637 A * | 1/1995 | Sanders | ............... | G01C 19/727 356/461 |
| 5,513,029 A * | 4/1996 | Roberts | ................ | H04B 10/035 359/333 |
| 5,771,255 A * | 6/1998 | Horiuchi | ............... | H04B 10/504 372/26 |
| 9,300,405 B2 | 3/2016 | Nuttgens | | |
| 2006/0008203 A1* | 1/2006 | Maeda | .................... | B82Y 20/00 385/27 |
| 2006/0257152 A1* | 11/2006 | Koganei | ............... | H04B 10/505 398/188 |
| 2009/0232518 A1* | 9/2009 | Caton | ................ | H04B 10/5051 398/193 |
| 2011/0110388 A1* | 5/2011 | Baroni | .................... | H01S 5/141 372/26 |
| 2012/0243874 A1* | 9/2012 | Logan, Jr. | ........ | H04B 10/25759 398/116 |
| 2013/0044975 A1* | 2/2013 | Schlarb | ................. | H01S 3/0014 385/3 |
| 2014/0169802 A1* | 6/2014 | Magri | .................. | H04B 10/541 398/183 |

* cited by examiner

*Primary Examiner* — Omar S Ismail
(74) *Attorney, Agent, or Firm* — Robert D. Atkins; Patent Law Group: Atkins and Associates, P.C.

(57) ABSTRACT

An OMA controller circuit utilizes a first ADC with an input coupled for receiving a residual error signal indicating a difference between a monitoring signal and a target data signal. A second ADC has an input coupled for receiving the target data signal. A first digital filter has an input coupled to an output of the first ADC, and a second digital filter has an input coupled to an output of the second ADC. A digital multiplier has a first input coupled to an output of the first digital filter and a second input coupled to an output of the second digital filter. An integrator has an input coupled to an output of the digital multiplier and an output providing an average error signal with sign and magnitude. The digital multiplier uses a four quadrant multiplier to perform a cross-correlation on the residual error and the target data signal.

19 Claims, 3 Drawing Sheets

DIGITAL IMPLEMENTATION OF CLOSED LOOP OPTICAL MODULATION AMPLITUDE CONTROLLER FOR LASER DIODE

FIELD OF THE INVENTION

The present invention relates in general to optical data transmission and, more particularly, to a digital implementation of a closed loop optical modulation amplitude controller for a laser diode.

BACKGROUND OF THE INVENTION

Optical communication involves the transmission of information by sending pulses of light, typically through an optical fiber cable. A laser diode is commonly used to transmit data in digital form over a telecommunications network. The light forms a carrier wave that is modulated to carry information. Optical transmission involves generating an optical signal independent of changes in the laser diode's operating environmental conditions or aging factors over time. Optical communications are known for low-loss and high data-carrying capacity. However, the quality of optical signal must be controlled in order to achieve the advantages of the optical communication system.

A laser driver circuit is used to control the transmission of light from the laser diode. One implementation of a closed-loop optical modulation amplitude (OMA) controller involves a laser monitor photodiode (MPD), as described in U.S. Pat. No. 9,300,405 ('405 patent). OMA is the difference between two optical power levels of a digital signal generated by an optical source, e.g., the laser diode. The '405 patent describes an analog implementation of circuitry which correlates the AC components of the monitoring signal with the data signal. The OMA controller can operate together with an average power controller to provide a complete laser driver system.

The block diagram of the OMA controller described in the '405 patent is shown in FIG. 1. A comparison is made between a low-frequency component of the monitoring signal $I_{MPD}$ and a low-frequency component of the data signal $I_{REF}$ to generate a residue signal $I_{RESIDUE}$. The residue signal is converted to a voltage using a transimpedance amplifier (TIA) and compared to the data signal in the OMA controller which ultimately controls the bias and modulation currents of the laser driver to drive the residue signal to zero. The residue signal and the data signal are filtered to remove high frequency components of the signal and AC coupled to remove the DC component of the signal in filters 50 and 54. The filtered signals are compared by multiplying (mixing) or correlating these two signals to generate a modulation control feedback signal.

Previous implementations of the system have used analog circuitry to implement the filtering, mixing and modulation control shown in blocks 50, 54, 56, 60, and 62. The output of integrator 60 is typically sampled at fixed, prescribed intervals, governed by a clock generator. At each clock period, the sign of the integrator output is used to decide whether to increment or decrement the Mod DAC value, and then integrator 60 is reset. The chosen clock period is a compromise between the required response speed and initialization time of the OMA control loop, and accuracy or noise rejection.

The analog implementation is limited in terms of accuracy, particularly at greater data rates. The analog signal is subject to DC offset, mismatches, and other errors, which reduces resolution in the output signal. Monitor photo diode 70 cannot resolve individual logic one and logic zero periods, particularly at high data rates.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

An optical data transmitter sends light along a fiber optical cable to an optical data receiver. The optical transmitter uses a laser diode driver circuit to modulate a light-emitting diode (LED), vertical-cavity surface-emitting laser (VCSEL), or laser diode in accordance with the transmitted data to generate the data carrying light signal. The laser diode driver circuit uses an OMA controller circuit, as described in the '405 patent, which is incorporated herein by reference. Alternatively, the laser diode driver circuit may use an OMA controller circuit, as described in U.S. patent application Ser. No. 16/274,261, entitled "CONFIGURABLE LASER MONITOR PHOTODIODE IN OPTICAL MODULATION AMPLITUDE CONTROLLER", by Jonah Edward Nuttgens et al., which is incorporated herein by reference.

Figure 2:
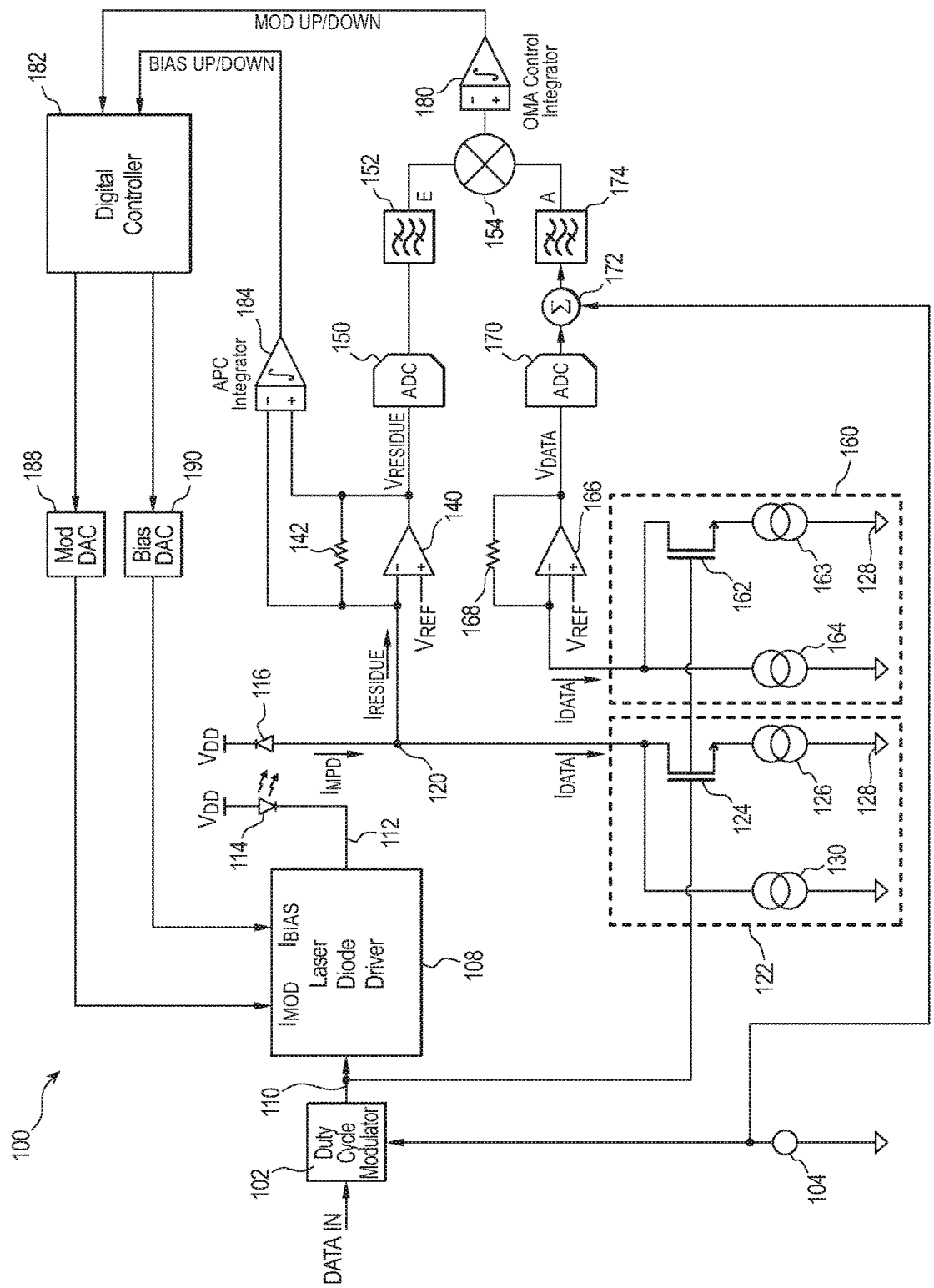
FIG. 2 illustrates a block diagram of a digital implementation of an OMA controller.

FIG. 2 illustrates a digital implementation of OMA controller 100 on a semiconductor device. A data input signal DATA IN is routed to duty cycle modulator 102, which also receives a low-frequency test signal (LFTS) from source 104. The output of duty cycle modulator 102 is coupled to input 110 of laser diode driver circuit 108 to generate a driver signal. For example, laser diode driver circuit 152 receives DATA IN at input 110 that contains the data that is to be modulated into the light signal for transmission. Laser diode driver circuit 108 receives parameter adjustment inputs, such as bias and modulation current values, in order to generate a driver signal at node 112. The driver signal consists of a bias current (sets Pd and modulation current (determines increase needed to reach $P_1$), which is switched on and off by the DATA IN. The driver signal causes the data input signal to be modulated onto a light signal from laser diode 114. Laser diode 114 is modulated between logic zero level $P_0$, and logic one level $P_1$. Laser diode 114 must be biased above a predetermined threshold for proper operation. OMA controller 100 uses the digital implementation in FIG. 2 to control the bias current, as well as the modulation current, to maintain an accurate optical output with varying temperature and other environmental conditions, over the lifetime of the device, while accounting for production variation in laser diode 114. As will be discussed below, OMA controller 100 uses a dual closed loop control to measure average output power and modulation depth (difference between $P_0$ and $P_1$) to control bias current and modulation current in laser diode 114.

An optical detector, such as laser monitor photodiode (MPD) 116, detects a portion of light generated by laser diode 114 and outputs a monitoring signal ($I_{MPD}$). Monitoring signal $I_{MPD}$ from MPD 116 is proportional to the light emitted by laser diode 114. The average current is proportional to the average power output of laser diode 114. $I_{MPD}$ is sourced into node 120. Reference waveform generator 122 is coupled to node 120 and sinks current $I_{DATA}$ from node 120. Reference waveform generator 122 includes transistor 124 with its drain coupled to node 120. The gate of transistor 124 receives DATA IN from node 110, and the source of transistor 124 is coupled to current source 126, which is referenced to power supply conductor 128 operating at ground potential. Current source 126 conducts current $I_{MON1}-I_{MON0}$. Current source 130 is coupled to node 120 and is referenced to power supply conductor 128. Current source 130 conducts current $I_{MON0}$. When DATA IN is logic zero, transistor 124 is non-conductive and $I_{DATA}=I_{MON0}$. When DATA IN is logic one, transistor 124 is conductive and $I_{DATA}=I_{MON1}$ ($I_{MON0}+I_{MON1}-I_{MON0}$). Accordingly, reference waveform generator 122 sinks $I_{DATA}$ ($I_{MON0}$ or $I_{MON1}$) from node 120 as the target or ideal value of $I_{MPD}$, corresponding to $P_O$ and $P_1$ state. At node 120, $I_{MPD}=I_{DATA}+I_{RESIDUE}$. When $I_{MPD}=I_{DATA}$, then $I_{RESIDUE}$ is zero, which is the target condition of laser diode 114. A non-zero $I_{RESIDUE}$ indicates a variance or error from the ideal operating condition of laser diode 114.

MPD transimpedance amplifier (TIA) 140 receives $I_{RESIDUE}$ from node 120 at its inverting input. MPD TIA 140 receives reference voltage $V_{REF}$ at its non-inverting input. Resistor 142 is coupled between the output of MPD TIA 140 and the inverting input of the amplifier. MPD TIA 140 provides $V_{RESIDUE}$ to an input of analog to digital converter (ADC) 150. The output of ADC 150 is coupled to an input of bandpass digital filter 152. Digital filter 152 removes high frequency content of the residue signal, as well as DC components, leaving the low-frequency AC content (10-20 MHz) of the residue signal. The low-frequency AC content of the digital version of $V_{RESIDUE}$ is coupled to a first input of digital multiplier 154.

Reference waveform generator 160 is substantially the same as reference waveform generator 122, e.g., scaled replica with corresponding transistor 162 and current sources 163 and 164 to generate the same target $I_{DATA}$ as reference waveform generator 122. MPD TIA 166 receives $I_{DATA}$ from reference waveform generator 160 at its inverting input. MPD TIA 166 receives reference voltage $V_{REF}$ at its non-inverting input. Resistor 168 is coupled between the output of MPD TIA 166 and the inverting input of the amplifier. MPD TIA 166 provides $V_{DATA}$ to an input of ADC 170. An optional digital equalization (not shown) can be performed in the data paths following MPD TIA 140 and 166 to match the skew between the path delays for the data signal and residue signal. ADCs 150 and 170 are implemented as delta-sigma type ADC with digital oversampling to minimize analog content of the ADC.

The output of ADC 170 is coupled to a first input of digital summer 172. LFTS from source 104 is applied to a second input of digital summer 172. The output of digital summer 172 is coupled to an input of bandpass digital filter 174. Digital filter 174 removes high frequency content of the data signal, including quantization noise, as well as DC components, leaving the low-frequency AC content (10-20 MHz) of the data signal. The low-frequency AC content of the digital version of $V_{DATA}$ is coupled to a second input of digital multiplier 154. Digital filters 152 and 174 are matched to provide greater flexibility than an analog filter. In one embodiment, digital filters 152 and 174 are implemented as a digital decimation filter, which trades sample-rate for resolution.

The direction of any error must be identified, i.e., modulation is too low or too high. Digital multiplier 154 performs a cross-correlation between the digital version of $V_{RESIDUE}$ labeled as E and the digital version of $V_{DATA}$. Labeled as A in FIG. 2. The cross-correlation yields a positive or negative outcome depending on the sign of the error. The output of digital multiplier 154 is E*A.

In one embodiment of digital multiplier 154, in order to determine when to sample the output of the (E*A) accumulator, another accumulator operates on the absolute value of A, referred to as abs(A). The second accumulator represents a measurement of the amount of low-frequency AC signal content in the data. The accumulator sign bit for the E*A accumulator is sampled when the first of the following two control limits are reached for the abs(A) accumulator: a time-limit is reached, and a limit is reached on the value of the abs(A) accumulator. The sampling of the E*A accumulator is performed at the first occurrence of either of these two events, which causes the rate of updates to modulation digital to analog converter (DAC) 188 to change dynamically in response to the data signal content. If there is a valid low-frequency AC component in the data signal, then the detection of cross-correlation between the data signal and residue signal is more reliable, and the update rate can be increased to improve the responsiveness of the loop. If there is insufficient low-frequency AC content, then the update rate is reduced to improve the reliability of detecting weak cross-correlation, in the presence of noise on the data signal and residue signal. The number of clock cycles used for the abs(A) accumulator threshold and time limit would be specific to the application and can be altered without affecting the underlying concept of the digital implementation. The output of the cross-correlation can be used by means other than an up/down signal to set the value of modulation DAC 188.

The output of digital multiplier 154 provides direction and magnitude of the error signal and is coupled to OMA control integrator or accumulator 180 to accumulate long term offset from zero. The output of OMA control integrator 180 indicates whether the modulation current is too low or too high.

The output of OMA control integrator 180 is coupled to a first input of digital controller 182 to provide modulation control up/down. The inputs of average power controller (APC) integrator 184 are coupled across resistor 142 to monitor bias current, and the output of APC integrator 184 is coupled to a second input of digital controller 182 to provide bias control up/down. The APC function within digital controller 182 is disclosed in U.S. Pat. No. 9,300,405, which is incorporated herein by reference. The modulation control channel of digital controller 182 is routed to modulation DAC 188, and the bias control channel of digital controller 182 is routed to bias DAC 190. The output of modulation DAC 188 is coupled to the $I_{MOD}$ input of laser diode driver 108, and the output of bias DAC 190 is coupled to the $I_{BIAS}$ input of laser diode driver 108, completing the dual closed loop control. The dual closed loop control inputs $I_{MOD}$ and $I_{BIAS}$ adjust the modulation current, as well as the bias current, from laser diode driver 108 to maintain an accurate optical output with varying temperature and other environmental conditions. The dual closed loop control inputs $I_{MOD}$ and $I_{BIAS}$ drive $I_{RESIDUE}$ from node 120 to zero. The error is averaged out over the long term to reduce offsets. The dual loop is closed and locked when the average output of multiplier 154 is zero. Any DC offset is eliminated in the cross-correlation between the residue signal and data signal. The cross-correlation provides automatic calibration within OMA controller 100 to protect against overload conditions, such as underflow or overflow values in the outputs of digital filters 152 and 174, and limiting the values of the settings for modulation DAC 188 and bias DAC 190 to avoid exceeding system specifications, including extinction ratio.

Figure 3:
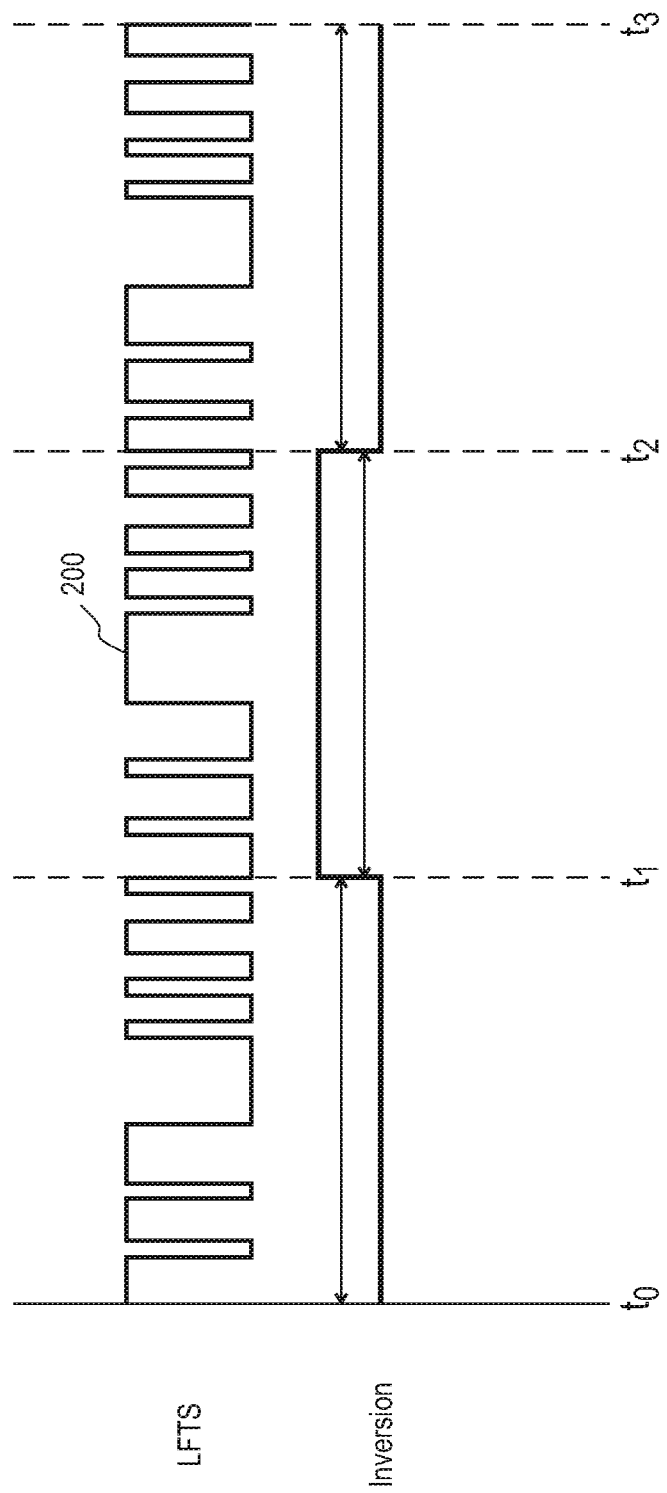
FIG. 3 illustrates a waveform plot of the low-frequency test signal.

In some operational cases, there may be little or no low-frequency content of DATA IN and $I_{RESIDUE}$. A small amount of LFTS from source 104 is injected into duty cycle modulator 102 to ensure that there is sufficient low-frequency content in the data signal during the digital multiplier error analysis. The LFTS signal is derived from a pseudorandom binary sequence (PRBS) generator, e.g., PRBS-7. PRBS-7 pattern repeats every 127 bits and has a slight DC offset since the occurrence of logic zeroes and logic ones in the pattern is not balanced. The PRBS pattern is inverted at the end of each sequence to remove any DC offset, i.e., the output sequence is inverted every 127 bits so that the DC bias is reversed. FIG. 3 represents a portion of LFTS signal 200, free of DC offset over 254 bit interval. LFTS signal 200 is digitally summed with DATA IN. Since there will be different delays through the analog path, i.e., from the duty cycle modulator and subsequent circuitry, and the digital path to the inputs of the digital summation, it is desirable to provide some delay compensation. A digital delay on the output of the LFTS source 104 can be introduced to duty cycle modulator 102 and another digital delay on the output to the digital summation stage. By setting delays on each path, it is possible to control the skew between the two signal paths seen at multiplier 154.

In the digital implementation of OMA controller 100, it is also possible to eliminate the summation stage and just use LFTS signal 200 for the cross-correlation. In this case, only the AC component of $I_{MPD}$, as introduced by duty cycle modulator 102, is used by the cross-correlation to remove dependence on the low-frequency components of the DATA IN. The above approach works over longer averaging periods and can provide improved immunity to the DATA IN pattern, as well as reducing power as the preceding stages to the summation stage can be disabled.

One of the two modes should be selected so that LFTS is summed with DATA IN for startup and initial convergence of the OMA control loop, followed by disabling the data signal and just using the LFTS to sustain the cross-correlation to reduce power and improve resilience to DATA IN pattern dependence. The ability to operate in these modes is facilitated by the digital implementation of OMA controller 100, particularly the multiplier operation, which provides improved accuracy over the prior art.

The digital implementation of OMA controller 100 allows for efficient clocking schemes to be used. For example, the update rate of modulation DAC 188 value can be made adaptive, according to the level of low-frequency signal content present in the data signal. A possible lock-up state can occur where a small positive offset error can be integrated and drive the modulation DAC 188 value to its maximum state. Although the digital implementation has the advantage that such errors can be minimized, further protection can also be provided by adding a slight subtraction to OMA control integrator 180, such that the modulation DAC value cannot run away into an undesired state.

Figure 1:
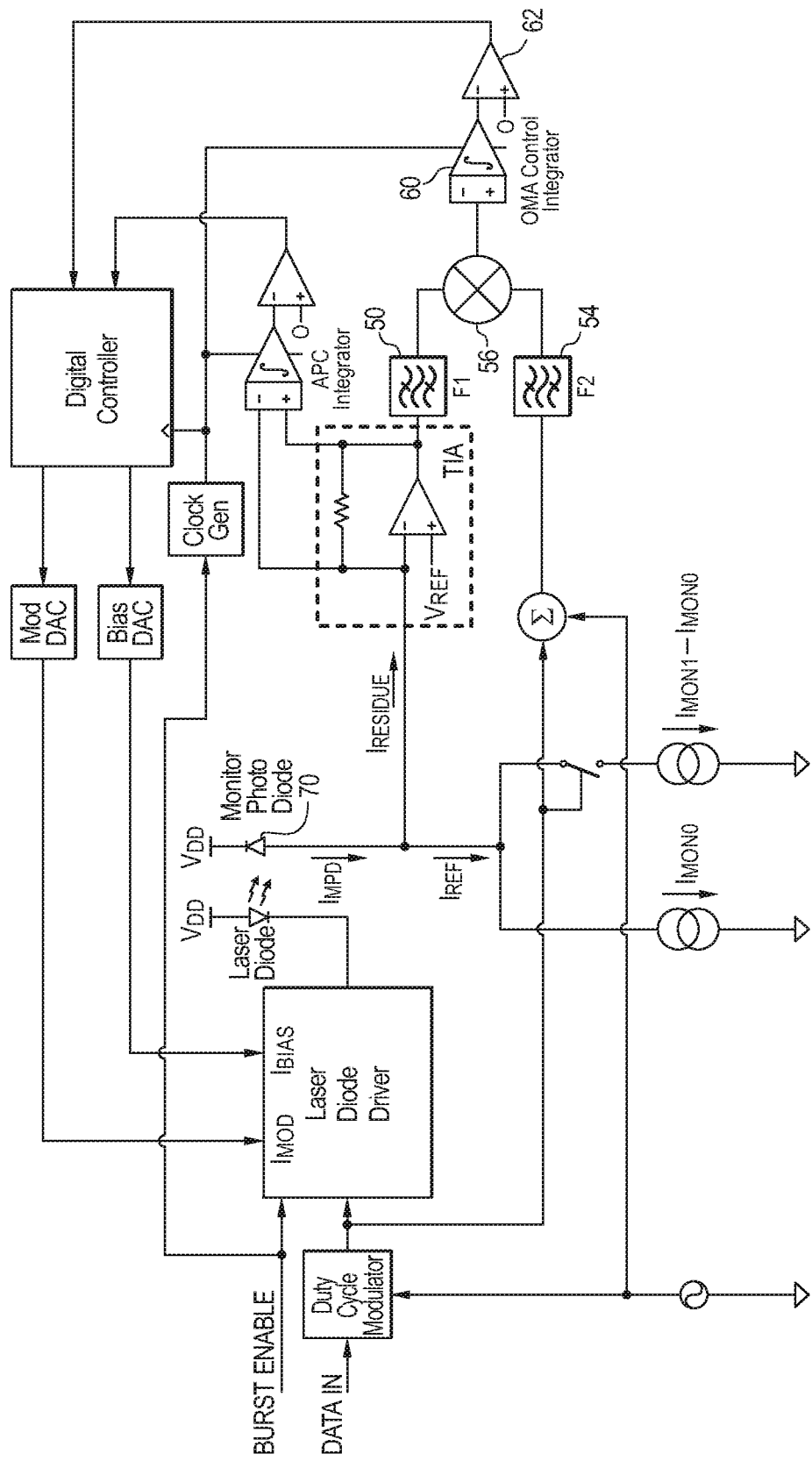
FIG. 1 illustrates a block diagram of a conventional analog OMA controller.

The digital implementation of OMA controller 100 provides several advantages over the prior art in FIG. 1. The prior art uses an analog correlation circuit to provide an output signal for a digital controller which controlled the laser modulation and bias currents. Moving the cross-correlation system into the digital domain allows further integration of the system and greater digital control. OMA controller 100 enables more advanced schemes to be implemented for calibration within the loop and facilitates the adoption of more complex correlation methods. Digital multiplier 154 does not have the inherent problems with DC offset of an analog multiplier and is thereby capable of greater accuracy. The implementation of filters 152 and 174 required for the monitoring and data paths is less complicated and can be more flexible with digital circuitry. OMA controller 100 provides greater portability between manufacturing processes and enables a reduction in silicon area and power for the system.

While one or more embodiments of the present invention have been illustrated in detail, the skilled artisan will appreciate that modifications and adaptations to those embodiments may be made without departing from the scope of the present invention as set forth in the following claims.

What is claimed:

1. A low-frequency AC comparison circuit, comprising circuitry including:
   a first analog to digital converter (ADC) including an input coupled for receiving a residual error signal indicating a difference between a monitoring signal and a target data signal;
   a second ADC including an input coupled for receiving the target data signal;
   a first digital filter including an input coupled to an output of the first ADC;
   a second digital filter including an input coupled to an output of the second ADC;
   a digital multiplier including a first input coupled to an output of the first digital filter and a second input coupled to an output of the second digital filter; and
   an integrator including an input coupled to an output of the digital multiplier and an output providing an average error signal with sign and magnitude;
   wherein the circuitry is configured to,
   receive a monitoring signal generated by an optical detector, the monitoring signal being proportional to an amount of light generated by an optical transmission device that transmits based on a data signal that is received by an optical driver;
   generate a low frequency AC component of the monitoring signal without a DC component of the monitoring signal and without signal components of the monitoring signal having a frequency greater than the bandwidth of the optical detector;
   generate a low frequency AC component of the data signal without a DC component of the data signal and without signal components of the data signal having a frequency greater than the bandwidth of the optical detector; and
   generate a modulation current control signal that is transmitted to the optical driver based on a comparison by cross-correlating the low frequency AC component of the monitoring signal and the low frequency AC component of the data signal in the digital domain.

2. The low-frequency AC comparison circuit of claim 1, wherein the first ADC and second ADC include a sigma delta ADC.

3. The low-frequency AC comparison circuit of claim 1, wherein the first digital filter and second digital filter each include a bandpass digital filter.

4. The low-frequency AC comparison circuit of claim 1, further including:
   a laser diode driver including a first input coupled for receiving the data signal;
   a laser diode generating an optical signal in response to the data signal;
   a laser monitor photodiode receiving a portion of the optical signal to provide a monitoring current proportional to the optical signal into a circuit node;
   a first reference generator coupled to the circuit node and sinking a first current corresponding to the target data signal; and
   a first transimpedance amplifier including an input coupled to the circuit node to receive a residual current as the difference between the monitoring current and the first current, and an output coupled to the input of the first ADC.

5. The low-frequency AC comparison circuit of claim 4, further including:
   a second reference generator sinking a second current corresponding to the target data signal;
   a second transimpedance amplifier including an input coupled to the second reference generator for the second current corresponding to the target data signal, and an output coupled to the input of the second ADC;
   a digital controller including a first input coupled to the output of the integrator and a first output providing a modulation correction signal and a second output providing a bias correction signal;
   a first digital to analog converter (DAC) including an input coupled to the first output of the digital controller and an output coupled to a modulation current control terminal of the laser diode driver; and
   a second DAC including an input coupled to the second output of the digital controller and an output coupled to a bias current control terminal of the laser diode driver.

6. An optical modulation amplitude (OMA) controller circuit, comprising:
   a first analog to digital converter (ADC) including an input coupled for receiving a residual error signal indicating a difference between a monitoring signal and a target data signal;
   a second ADC including an input coupled for receiving the target data signal;
   a first digital filter including an input coupled to an output of the first ADC;
   a second digital filter including an input coupled to an output of the second ADC;
   a digital multiplier including a first input coupled to an output of the first digital filter and a second input coupled to an output of the second digital filter; and
   an integrator including an input coupled to an output of the digital multiplier and an output providing an average error signal with sign and magnitude.

7. The OMA controller circuit of claim 6, wherein the first ADC and second ADC include a sigma delta ADC.

8. The OMA controller circuit of claim 6, wherein the first digital filter and second digital filter each include a bandpass digital filter.

9. The OMA controller circuit of claim 6, wherein the digital multiplier performs a cross-correlation on the residual error signal and the target data signal.

10. The OMA controller circuit of claim 6, further including:
    a laser diode driver including a first input coupled for receiving a data signal;
    a laser diode generating an optical signal in response to the data signal;
    a laser monitor photodiode receiving a portion of the optical signal to provide a monitoring current proportional to the optical signal into a circuit node;
    a first reference generator coupled to the circuit node and sinking a first current corresponding to the target data signal; and
    a first transimpedance amplifier including an input coupled to the circuit node to receive a residual current as the difference between the monitoring current and the first current, and an output coupled to the input of the first ADC.

11. The OMA controller circuit of claim 10, further including:
    a second reference generator sinking a second current corresponding to the target data signal; and
    a second transimpedance amplifier including an input coupled to the second reference generator for the second current corresponding to the target data signal, and an output coupled to the input of the second ADC.

12. The OMA controller circuit of claim 10, further including:
    a digital controller including an input coupled to the output of the integrator and a first output providing a modulation correction signal and a second output providing a bias correction signal;
    a first digital to analog converter (DAC) including an input coupled to the first output of the digital controller and an output coupled to a modulation current control terminal of the laser diode driver; and
    a second DAC including an input coupled to the second output of the digital controller and an output coupled to a bias current control terminal of the laser diode driver.

13. A method of making an OMA controller circuit, comprising:
    providing a first analog to digital converter (ADC) including an input coupled for receiving a residual error signal indicating a difference between a data signal and a target data signal;
    providing a second ADC including an input coupled for receiving the target data signal;
    providing a first digital filter including an input coupled to an output of the first ADC;
    providing a second digital filter including an input coupled to an output of the second ADC;
    providing a digital multiplier including a first input coupled to an output of the first digital filter and a second input coupled to an output of the second digital filter; and
    providing an integrator including an input coupled to an output of the digital multiplier and an output providing an average error signal with sign and magnitude.

14. The method of claim 13, wherein the first ADC and second ADC include a sigma delta ADC.

15. The method of claim 13, wherein the first digital filter and second digital filter each include a bandpass digital filter.

16. The method of claim 13, wherein the digital multiplier performs a cross-correlation on the residual error signal and the target data signal.

17. The method of claim 13, further including:
    providing a laser diode driver including a first input coupled for receiving the data signal;
    providing a laser diode generating an optical signal in response to the data signal;

providing a laser monitor photodiode receiving a portion of the optical signal to provide a monitoring current proportional to the optical signal into a circuit node;
providing a first reference generator coupled to the circuit node and sinking a first current corresponding to the target data signal; ands providing a first transimpedance amplifier including an input coupled to the circuit node to receive a residual current as the difference between the monitoring current and the first current, and an output coupled to the input of the first ADC.

18. The method of claim 17, further including:
providing a second reference generator sinking a second current corresponding to the target data signal; and
providing a second transimpedance amplifier including an input coupled to the second reference generator for the second current corresponding to the target data signal, and an output coupled to the input of the second ADC.

19. The method of claim 18, further including:
providing a digital controller including an input coupled to the output of the integrator and a first output providing a modulation correction signal and a second output providing a bias correction signal;
providing a first digital to analog converter (DAC) including an input coupled to the first output of the digital controller and an output coupled to a modulation current control terminal of the laser diode driver; and
providing a second DAC including an input coupled to the second output of the digital controller and an output coupled to a bias current control terminal of the laser diode driver.

* * * * *